United States Patent
Pickerd et al.

(10) Patent No.: US 7,254,498 B2
(45) Date of Patent: Aug. 7, 2007

(54) METHOD AND APPARATUS FOR PROVIDING BANDWIDTH EXTENSION AND CHANNEL MATCH FOR OSCILLOSCOPES

(75) Inventors: John J. Pickerd, Hillsboro, OR (US); Marvin E. La Voie, Beaverton, OR (US); Rolf Anderson, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 579 days.

(21) Appl. No.: 10/686,412

(22) Filed: Oct. 14, 2003

(65) Prior Publication Data

US 2005/0080831 A1    Apr. 14, 2005

(51) Int. Cl.
*G06F 19/00* (2006.01)
(52) U.S. Cl. ..................... 702/67; 324/76.11
(58) Field of Classification Search ................. 702/67, 702/121, 125, 66; 324/76.11, 76.12–19
See application file for complete search history.

(56) References Cited

U.S. PATENT DOCUMENTS 6,542,914 B1    4/2003  Pupalaikis
2004/0223569 A1*  11/2004  Hagen et al. ............... 375/355

* cited by examiner

*Primary Examiner*—Edward Raymond
(74) *Attorney, Agent, or Firm*—Thomas F. Lenihan; Moser, Patterson, Sheridan LLP (57) ABSTRACT

A method and apparatus for selectively providing bandwidth extension and channel matching for acquired signals under test (SUT). The method and apparatus includes a signal acquisition device for acquiring a signal under test (SUT) and generating therefrom a stream of acquired samples, where the signal acquisition device having associated with it a first bandwidth defining a nominal pass band. At least one digital filter imparts a gain equalization function to the acquired SUT samples within a spectral region including and extending beyond the nominal passband. A controller generates a display signal suitable for use by a display device, where the display signal representing waveform imagery associated with the gain equalized SUT.

26 Claims, 9 Drawing Sheets

METHOD AND APPARATUS FOR PROVIDING BANDWIDTH EXTENSION AND CHANNEL MATCH FOR OSCILLOSCOPES

FIELD OF THE INVENTION

The invention relates generally to signal acquisition and measurement systems and, more particularly, to a method and apparatus for providing bandwidth extension and channel matching capabilities.

BACKGROUND OF THE INVENTION

Oscilloscopes have for many years provided multiple input channels and a means for calibration of those channels in terms of gain and course frequency response adjustments. However, as bandwidths extend into the GHz region it becomes more and more difficult to provide a flat response at all frequencies. Some oscilloscope manufactures have incorporated a high frequency control DAC used to tune the 3 dB bandwidth point of each channel. However, this only controls a band of high frequency with a general gain control for the whole band, as opposed to controlling the gain at each frequency. Thus the flatness of each individual scope channel bandwidth varies by several dB as a function of frequency. In addition there are differences in frequency response between channels that can be significant in some applications.

Scopes have also traditionally made adjustments in calibration at manufacturing in order to match channels as much as possible. Some of the adjustments made include DC offset, gain, and time skew. The match between scope channels is adequate for many applications. However, applications such as using two channels to look at a differential signals are limited by the degree of mismatch in current generation oscilloscopes.

SUMMARY OF INVENTION

These and other deficiencies of the prior art are addressed by the present invention of a method and apparatus for selectively providing bandwidth extension and channel matching for acquired signals under test (SUT). In one embodiment, the method and apparatus includes a signal acquisition device for acquiring a signal under test (SUT) and generating therefrom a stream of acquired samples, where the signal acquisition device having associated with it a first bandwidth defining a nominal pass band. At least one digital filter imparts a gain equalization function to the acquired SUT samples within a spectral region including and extending beyond the nominal passband. A controller generates a display signal suitable for use by a display device, where the display signal representing waveform imagery associated with the gain equalized SUT.

In a second embodiment, the signal acquisition device having a plurality of channels for acquiring respective signals under test (SUT), generates therefrom respective streams of acquired samples. A plurality of digital filters respectively associated with a channel filter the acquired SUT samples. The controller generates a display signal suitable for use by a display device, where the display signal represents waveform imagery associated with at least one of the digitally filtered SUT sample streams and, in a first mode of operation, causes the digital filters to operate in a manner tending to equalize gain parameters of the plurality of channels.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The subject invention will be described within the context of a signal acquisition and measurement device such as a digital storage oscilloscope (DSO). However, it will be appreciated that the subject invention has applicability to other signal acquisition devices and, more particularly, those signal acquisition devices or display devices providing time-based display of acquired data or other information.

More specifically, the present invention is discussed in terms of an exemplary bandwidth control program (e.g., a vertical control program) tool, which is installed (i.e., stored) in local memory of a digitizing signal acquisition and measurement device, such as the TDS6000 and TDS7000 series oscilloscopes manufactured by Tektronix, Inc. of Beaverton, Oreg. (or other DSO/acquisition devices), to transform the DSO into an analysis tool that quickly measures and analyzes real-time signals under test (SUTs) in a circuit being tested. A DSO implementing the present invention optionally generates detailed test reports in customizable formats. However, one skilled in the art will appreciate that the teachings discussed herein may be implemented in other digitizing measurement devices.

In particular, the invention implements a vertical control management program, which traditionally contains bandwidth menu select items for frequencies illustratively at 20 MHz, 25 MHz, 100 MHz, and/or 250 MHz, as well as a Full bandwidth response. In one embodiment, a "Bandwidth Extension" menu item is included in the vertical bandwidth menu. In particular, when a user selects the bandwidth extension feature when the sample rate of the channels are at maximum rate or higher equivalent time (ET) sample rates, then a digital equalization filter is applied to the channel corresponding to the signal under test (SUT) to extend the bandwidth of the oscilloscope beyond the analog bandwidth.

In a second embodiment, a "Channel Match" menu item is included in the vertical bandwidth menu. In particular, when a user selects the channel match feature during instances where the sample rate of the channels are at maximum rate or higher ET rates, then a digital equalization filter is applied to each of at least two scope channels to make them match to within a tight tolerance, such as 0.5 dB over a pass band and/or a transition band. Additionally, the filter response is held close to linear phase. It is noted that the channel match function does not necessarily extend bandwidth, and in fact may decrease bandwidth depending on how the oscilloscope designer implements it.

Figure 1A:
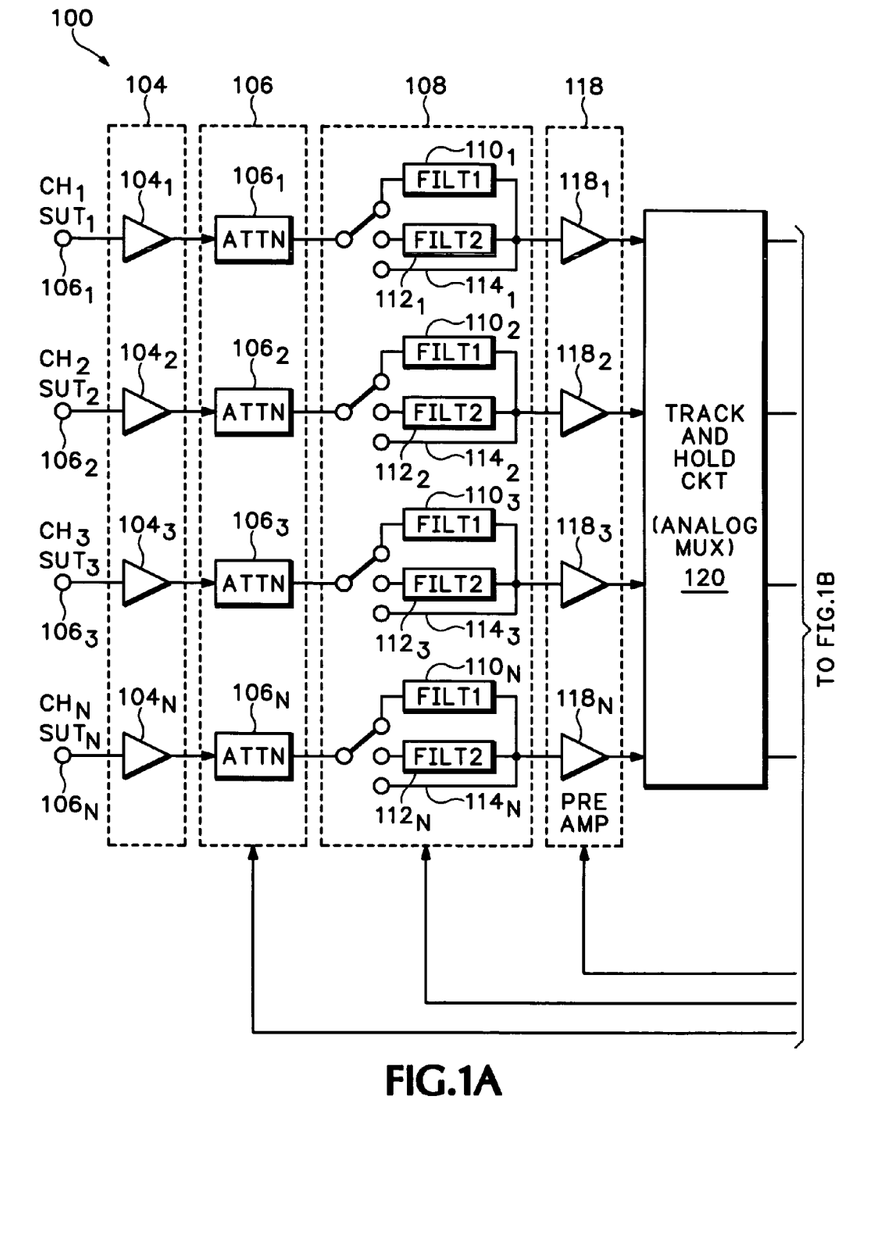
FIG. 1 depicts a high level block diagram of a signal acquisition and measurement system according to an embodiment of the present invention.
Figure 1B:
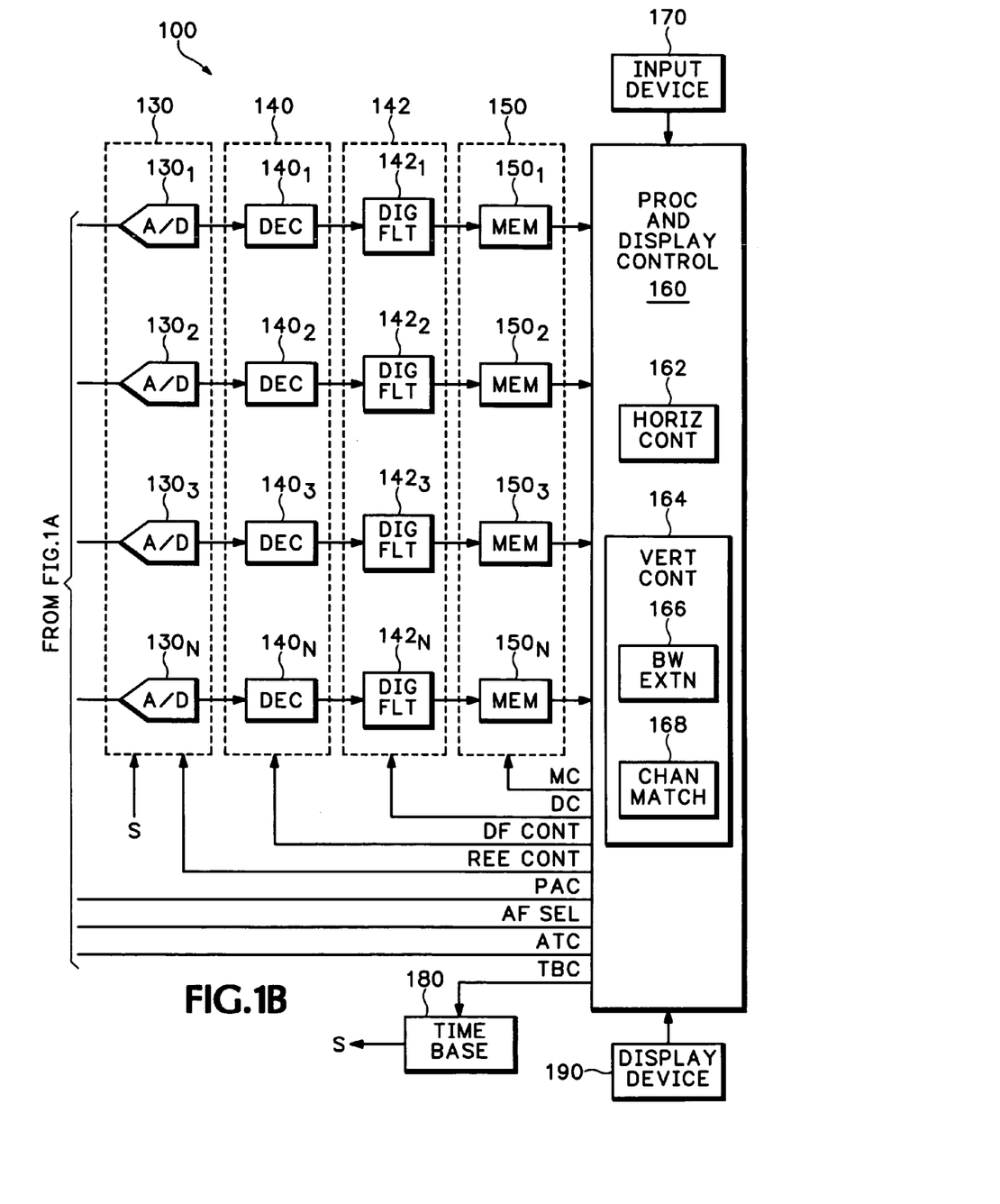

FIG. 1 depicts a high level block diagram of a signal acquisition and measurement system according to an embodiment of the present invention. Specifically, the system 100 of FIG. 1 may be a digital storage oscilloscope that receives a plurality of input signals under test (SUT) denoted as signals under test $SUT_1$–$SUT_N$ (collectively signals under test SUT) over a respective plurality of channels $CH_1$–$CH_N$ 102 (collectively channels 102), where N is an integer, though a single channel may also be implemented within the context of bandwidth extension of the present invention, as discussed below in further detail.

The system 100 of FIG. 1 comprises a plurality of buffers $104_1$–$104_N$ (collectively buffers 104), a plurality of attenuators $106_1$–$106_N$ (collectively attenuators 104), a plurality of analog filter devices $108_1$–$108_N$ (collectively analog filters 108), a plurality of preliminary amplifiers $118_1$–$118_N$ (collectively preliminary amplifiers 118), a track and hold circuit 120, a plurality of analog-to-digital (A/D) converters $130_1$–$130_N$ (collectively A/D converters 130), a plurality of digital filters $142_1$–$142_N$ (collectively digital filters 142), a plurality of decimators $140_0$–$140_N$ (collectively decimators 140), a plurality of acquisition memories $150_1$–$150_N$ (collectively acquisition memory 150), a processing and display controller 160, an input device 170, a timebase 180, and a display device 190.

Each of N input channels 102 receives a respective signal under test SUT, which SUT is buffered via a respective buffer 104 and then optionally attenuated via a respective attenuator 106. Each buffer 104 is used to store the analog SUT information prior to processing, as is conventionally known in the art. Further, each attenuator circuit 106 allows a known power or signal level to be reduced by a predetermined factor, usually expressed as decibels, and is achieved without introducing distortion. An advantage of the attenuator is that the attenuator is able to change a source or load, which might be reactive, into one which is precisely known and resistive, since the attenuator is made from non-inductive resistors. In one mode of operation, an attenuator control (ATC) signal from the processor and display control 160 causes the attenuators 106 to reduce the magnitudes of their respective signals under test to levels within operable ranges within the channel 102.

The output of the attenuators 106 is then sent to the analog filter device 108, where analog filtering of the SUT may optionally be provided. In particular, each filtering device 108 associated with each channel 102 illustratively comprises a first filter $110_1$–$110_N$ (collectively first filters 110), a second filter $112_1$–$120_N$ (collectively second filters 112), and a bypass (or substantially non-filter function) $114_1$–$114_N$ (collectively bypass 114). In one embodiment, the first filter 110 may be a 20 MHz or 25 MHz bandpass filter, and the second filter 112 may be a 100 MHz or 225 MHz bandpass filter. One skilled in the art will recognize that other filter values may be implemented for the first and second filters 110 and 112, and such exemplary filter values should not be considered as limiting.

In one mode of operation, an analog filter select (AFSEL) signal from the processor and display control 160 enables a user to selectively control either of the bandpass filters 110 and 112 or the bypass 114. Thus, a user may constrain the bandwidth by selecting the first filter 110 or the second filter 112 to eliminate higher frequency signal contributions (e.g., noise), which is outside the frequency band the user is interested. In one embodiment, in an instance that a user does not actively make a selection, the bypass 114 is set as a default. In this instance, the full signal from the SUT is sent to the amplifier 118 without any analog filtering occurring. It is noted that the bandwidth capacity of the scope channel (e.g., 1, 4, 6, or 8 GHz) is initially defined by the physical parameters of the analog circuitry in the front end of the scope (i.e., the buffers 104, attenuators 106, bypass signal path 114, amplifiers 118, and track and hold circuit 120 (hereinafter the analog circuitry portion or front end of the scope)). However, as will be discussed below, one inventive aspect of the invention is to allow a user to extend the bandwidth of the channel (e.g., from 6 GHz out to 8 GHz) by selectively providing digital filtering to the digitized signal under test.

Referring to FIG. 1, the output of the analog filters 108 is amplified by a respective preamp 118 and processed by the track and hold circuit 120. The track and hold circuit 120, illustratively an analog multiplexer, holds each SUT steady for a period of time sufficient to enable acquisition by a respective A/D converter 130.

The preamps 118 are responsive to a preamp control signal PAC provided by the processing and display controller 160 to perform any or all of an amplification function, a range adjust function, and a range offset function. In one mode of operation, the preamp control signal PAC causes the preamps 118 to amplify their respective signals under test to levels sufficient to utilize substantially all of the dynamic range of their corresponding A/D converters. In other modes of operation, such as discussed in more detail below with respect to the vertical control aspects of the present invention, the preamps 118 are caused to amplify their respective signals under test to normalize or otherwise conform subsequent acquired sample streams to a desired vertical parameter.

The A/D converters 130 receive and digitize their respective signals under test in response to a sample clock signal S produced by the timebase 180 to produce thereby respective sample streams. The sample clock signal S is preferably a clock signal adapted to cause the A/D converters 130 to operate at a maximum sampling rate, though other sampling rates may be selected. The timebase 180 is responsive to a timebase control signal TBC produced by the controller 160 to change frequency and/or pulse width parameters associated with the sample clock signal S. Optionally, the A/D converters 130 include a controllable voltage reference source (not shown) that produces a voltage reference used by the A/D converter 130 to establish the full scale voltage range of the input signal range (i.e., the Voltage level of the signal provided by the preamp 118 causing a maximum digital output from the A/D converter). The controllable voltage reference source is controlled by a signal REFCON produced by the processing and display controller 160. By decreasing the reference voltage level utilized by the A/D converter, the magnitude of the SUT producing the maximum magnitude output sample is reduced. Similarly, by increasing the reference voltage level utilized by the A/D converter, the magnitude of the SUT producing the maximum magnitude output sample is increased.

The sample streams produced by the A/D converters 130 are coupled to respective decimators 140. Each decimator 140 processes its received digitized signal under test according to a respective processing algorithm or decimation mode, such as a sub-sampling mode, a peak detection mode (e.g., min-max detection), a high resolution mode (e.g., a box-car averaging mode) or other mathematical function, algorithm or mode. The mode of operation of each decimator 140 may be preprogrammed such as with an application specific integrated circuit (ASIC) or field programmable gate array (FPGA), or may be programmed "on the fly" in response to a decimator control signal DC produced by the processing and display controller 160. The decimators 140 may utilize different respective functions, the same respective functions, or a combination thereof.

The decimators 140 optionally process respective received sample streams to produce respective decimated (sample reduced) sample streams in response to respective received sample streams. For example, in response to receiving a digital sample stream from first A/D converter $130_1$, first decimator $140_1$ produces a corresponding decimated sample stream.

The output of each decimator 140 is coupled to a respective digital filter 142. It is noted that in instances where a user selects the bandwidth extension or channel match feature of the present invention, decimation is typically not used and the decimators 140 pass their respective output signal to memory 150 for subsequent processing via the respective digital filters 142. In other words, the decimators 140 may be utilized to provide a signal path between the A/D converters 130 and memory 150, without decimating received digitized signals under test.

The digital filters 142 may be used to remove, attenuate, or amplify selected frequencies or spectral regions from the sampled SUT. Specifically, the bandwidth of each channel is defined as the highest frequency at which the channel gain is down by 3 dB. Oscilloscopes have relied on the characteristics of the hardware of a channel to determine the bandwidth capabilities of the scope (i.e., each channel). In one embodiment, the digital filters 142 enable a user to extend the bandwidth to a higher frequency by filtering the SUT after the signal has been digitized, as discussed below in further detail.

The sample streams produced by the decimators 140 (i.e., decimated or non-decimated formats) are stored in corresponding portions of acquisition memory 150. The acquisition memory 150 may be a contiguous or non-contiguous memory and may, optionally, allocate respective portions to the respective decimators 140.

The processing and display controller 160 is used to manage the various operations of the signal acquisition system 100. The processing and display controller 160 performs various processing and analysis operations on the data samples stored within the acquisition memory 150. An embodiment of the processing and display controller 160 will be described in more detail below with respect to FIG. 2.

The processing and display controller 160 receives user commands via the input device 170, such as a keypad, pointing device, touch pad, among others. The processing and display controller 160 provides image-related data to the display device 190, illustratively a cathode ray tube (CRT), liquid crystal display (LCD) or other display device. The display device 190 may also comprise a touch screen device such that the display device 190 provides both user input and user output functionality. This touch screen embodiment is especially useful within the context of user interface functionality described in more detail below.

The processing and display controller 160 includes a horizontal control function 162 and a vertical control function 164. The horizontal control function 162 adapts and/or constrains horizontal display parameters (i.e., signal time parameters) of waveforms presented via the display device 190. The vertical control function 164 adapts and/or constrains vertical display parameters (i.e., signal amplitude parameters) of waveforms presented via the display device 190. Moreover, the vertical control function 164 provides programs for implementing the bandwidth extension function 166 and channel match function 168 of the present invention.

Figure 2:
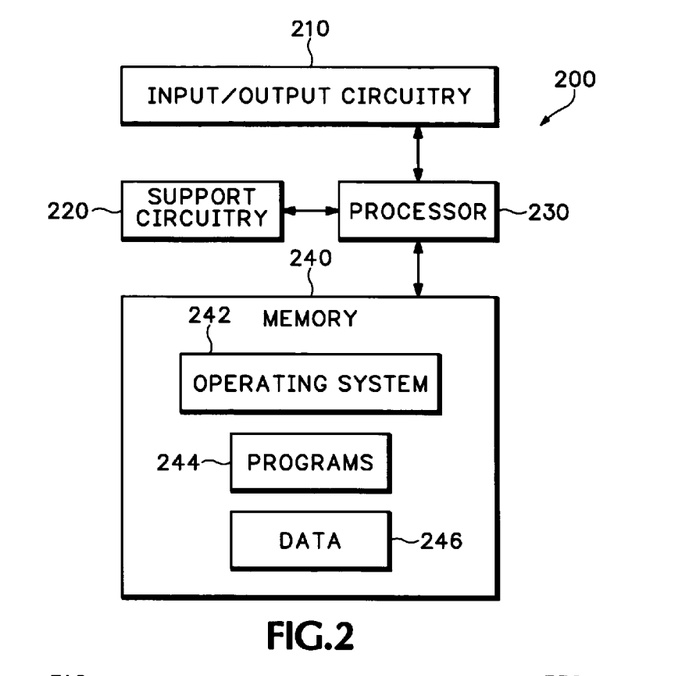
FIG. 2 depicts a high level block diagram of a processing and display controller suitable for use in the signal acquisition system of FIG. 1.

FIG. 2 depicts a high level block diagram of a controller suitable for use in the signal acquisition system 100 of FIG. 1. Specifically, the controller 200 of FIG. 2 may be employed to implement functions of the processing and display controller 160. The controller 200 may also be used to implement various functions within the system 100 of FIG. 1 in which software and/or firmware functionality is described.

The controller 200 of FIG. 2 comprises a processor 230 as well as memory 240 for storing various control programs and other programs 244 and data 246. The memory 240 may also store an operating system 242 supporting the programs 244, such as the Windows® operating system manufactured by Microsoft Corporation of Redmond, Wash. Other operating systems, frameworks and environments suitable for performing the tasks described herein will also be appreciated by those skilled in the art and informed by the teachings of the present invention. For example, various operating systems such as those provided by Apple Computer Corporation of Cupertino, Calif. and the various Unix-derived operating systems may also be utilized within the context of the present invention.

The processing 230 cooperates with conventional support circuitry such as power supplies, clock circuits, cache memory and the like as well as circuits that assist in executing the software routines stored in the memory 240. As such, it is contemplated that some of the steps discussed herein as software processes may be implemented within hardware, for example as circuitry that cooperates with the processor 230 to perform various steps. The controller 200 also contains input/output (I/O) circuitry 210 that forms an interface between the various functional elements communicating with the controller 200. Although the controller 200 is depicted as a general purpose computer that is programmed to perform various control functions in accordance with the present invention, the invention can be implemented in hardware as, for example, an application specific integrated circuit (ASIC) or field programmable gate array (FPGA). As such, the process steps described herein are intended to be broadly interpreted as being equivalently performed by software, hardware or a combination thereof.

The programs 244 stored within the memory 240 may include programs adapted to implement the bandwidth extension function 166 and channel match function 168, provided by the processing and display controller 160. The programs 244 may also include programs adapted to provide the various user interface functions, system control functions and display/image modification functions discussed herein.

The signal acquisition system 100 of FIG. 1 generally receives signals under test (SUT), which are digitized, optionally decimated and subsequently processed to derive respective waveforms for display. The displayed waveforms have associated with them a horizontal parameter and vertical parameter. The horizontal parameter comprises a time parameter, while the vertical parameter comprises an amplitude parameter. Control circuitry is responsive to user inputs to adjust the timebase (i.e., time per horizontal division) and amplitude (i.e., Volts per vertical division) of displayed waveform(s). That is, in an oscilloscope having a display device including a grid pattern, a user may select the number of Volts (or other parameter) represented by each vertical segment and the amount of time represented by each horizontal segment.

For example, a display frame is a region on a display screen that bounds the region in which an acquired waveform will be displayed along with its graticules. The vertical range of an acquired signal is preferably displayed over the full vertical height of the display frame when a zoom mode of operation is not active. Derived waveforms such as mathematical functions or reference waveforms have their respective vertical scale and offset parameters specified with respect to the vertical frame and number of grids that are in use. The scale for a display readout is preferably specified as units per division. The vertical height of the display frame will be referred to herein as the vertical display range.

Additionally, there may be any number of display frames in effect simultaneously on the display, which display frames may be of various sizes and proportions. Derived waveforms, such as mathematically derived waveforms based upon acquired signals under test, are displayed within the frame according to user specified range and offset parameters. For a detailed understanding of the horizontal and vertical control functions, the reader is directed to U.S. patent application Ser. No. 10/374,914, filed Feb. 25, 2003, and entitled "Method of Constraints Control for Oscilloscope Timebase Subsection and Display Parameters", and U.S. patent application Ser. No. 10/374,416, filed Feb. 25, 2003, and entitled "Method of Constraints Control for Oscilloscope Vertical Subsection and Display Parameters", both of which are incorporated by reference herein in their entireties.

Within the context of the present invention, the bandwidth extension function 166 and channel match function 168 are controlled via a user interface (i.e., the input device 170) or computer network interface (not shown). The bandwidth extension function 166 applies digital filter equalization techniques to the oscilloscope channels in order to extend the bandwidth of the scope channel to a wider bandwidth than the non-equalized bandwidth of the preceding analog portion of channel. Moreover, the channel match function 168 applies digital filter equalization to slightly reduce the normal "full bandwidth" of the analog channel in order to flatten the response to, illustratively, within 0.3 dB accuracy between channels over the bandwidth, as well as to provide linear phase responses between the channels 102. That is, the gain at each frequency of the equalized waveforms is within 0.3 dB between the channels 102, until the waveform begins to roll off.

Figure 3:
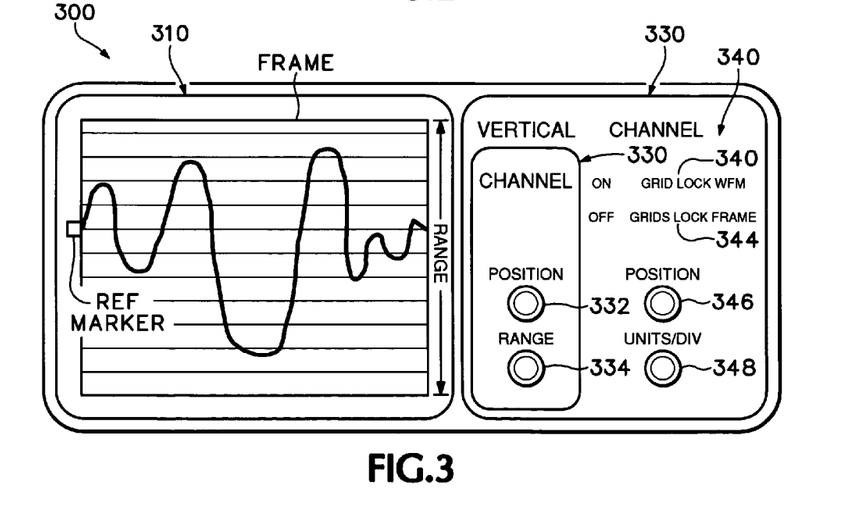
FIGS. 3–5 depict user interface screens suitable for use in an embodiment of the present invention.

FIG. 3 depicts a user interface suitable for use in an embodiment of the present invention. The user interface 300 of FIG. 3 is suitable for display on, for example, a touch screen display device such as discussed above with respect to FIG. 1. That is, the objects displayed within the context of the user interface (and its submenus such as the submenus shown in FIGS. 4 and 5) are optionally responsive to direct user manipulation to provide the various functionality described herein.

The user interface 300 of FIG. 3 comprises a waveform display region 310 and a control region 320. The waveform display region 310 displays one or more waveforms for a peak-to-peak amplitude or range that is controlled by the user. The waveform display region 310 is depicted as comprising a plurality of horizontal lines delineating discrete portions of the vertical display range. A Volts (or other unit) per division parameter is represented by the portion of range between adjacent horizontal lines. Also shown in the waveform display region 310 is a reference marker that indicates the point within the displayable range at which an initial vertical grid delineator is located. While not shown, vertical lines delineating a time per division parameter are normally displayed with the horizontal lines to form thereby a display grid. The acquired waveforms are nominally fit to the width of the waveform display region 310. The acquired waveforms are displayed with a duration parameter and range parameter adapted to fit, respectively, the width and height of the display frame when a zoom mode is off.

The control region 320 comprises a vertical signal acquisition control region 330 and a display control region 340. The display control region 340 comprises various control functions, such as a grid lock to waveform (GRID LOCK WFM) control 342, a grid lock to frame control 344, a position control 346 and a units per division control 348. The units per division control 348 is used to adjust the displayed Volts per division parameter. For a detailed understanding of the vertical signal control region 330 and the display control region 340, the user is redirected to above mentioned U.S. patent application Ser. No. 10/374,416, filed Feb. 25, 2003.

Figure 4:
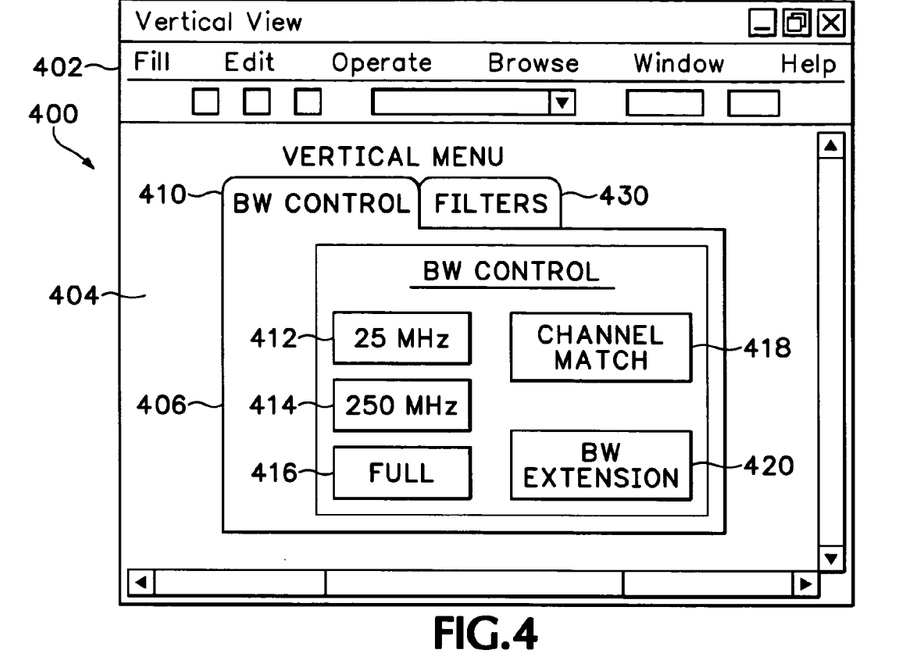

FIG. 4 depicts an exemplary user interface suitable for selecting bandwidth extension and channel match functions 166 and 168 of the present invention. In particular, FIG. 4 depicts a vertical channel submenu 400, which may be invoked by selecting one of the controls within the vertical signal control region 330 of the user interface 300 of FIG. 3. The vertical channel submenu 400 of FIG. 4 may also be selected directly or accessed via a remote computing device. Specifically, the vertical channel submenu 400 of FIG. 4 enables user selection of the bandwidth extension function 166 and the channel match function 168.

In one embodiment, the vertical channel submenu comprises a WINDOWS® compatible type GUI, having a tool bar 410, a background area 404, and a vertical menu section 406 overlaying the background 404 having a tabbed bandwidth control section 410 and a tabbed filter section 430. When a user selects the bandwidth control section tab 410, a plurality of buttons is presented to the user for selection. For example, a first button (e.g., 25 MHz) 412 corresponds to the first analog filter 110, a second button 414 (e.g., 250 MHz) corresponds to the second analog filter 112, a third button 416 (e.g., FULL) corresponds to the bypass 114, a fourth button (e.g., channel match) 418 provides the channel match function 168, and a fifth button (e.g., bandwidth extension) 418 provides the bandwidth extension function 166. Thus, a user may select the analog filter type (or no analog filtering) suitable for the signal under test (SUT), as well as the bandwidth extension or channel match functions 166 and 168 of the present invention.

For example, in an instance the user desires to measure frequency components of a SUT below 25 MHz, the user selects (clicks if using a mouse) the first filter button 412.

The AF SEL signal illustratively switches to (selects) the first analog filter $110_1$ such that frequencies above 25 MHz are removed (filtered) from the signal under test. It is noted that the filter values shown are for illustrative purposes only and accordingly, should not be considered as limiting. Further, in one embodiment, the front end of the scope is normally set to the bypass 114 by default. As such, a user only has to utilize the FULL button 416 in instances where the first or second analog filters were previously selected.

The user selectable bandwidth extension function 166 of the present invention allows a user to selectively extend the bandwidth of the SUT in an instance where a full sample record of the SUT is being received. That is, the user first selects the FULL button 416 if the analog filtering is turned on to switch to the bypass 114 pertaining to the channel facilitating the SUT (i.e., turn the analog filters off). The process and display controller 160 then sends an AF SEL signal to the switch to the bypass 114, thereby allowing the entire SUT to pass through for digital processing by the A/D converter 130.

Figure 6:
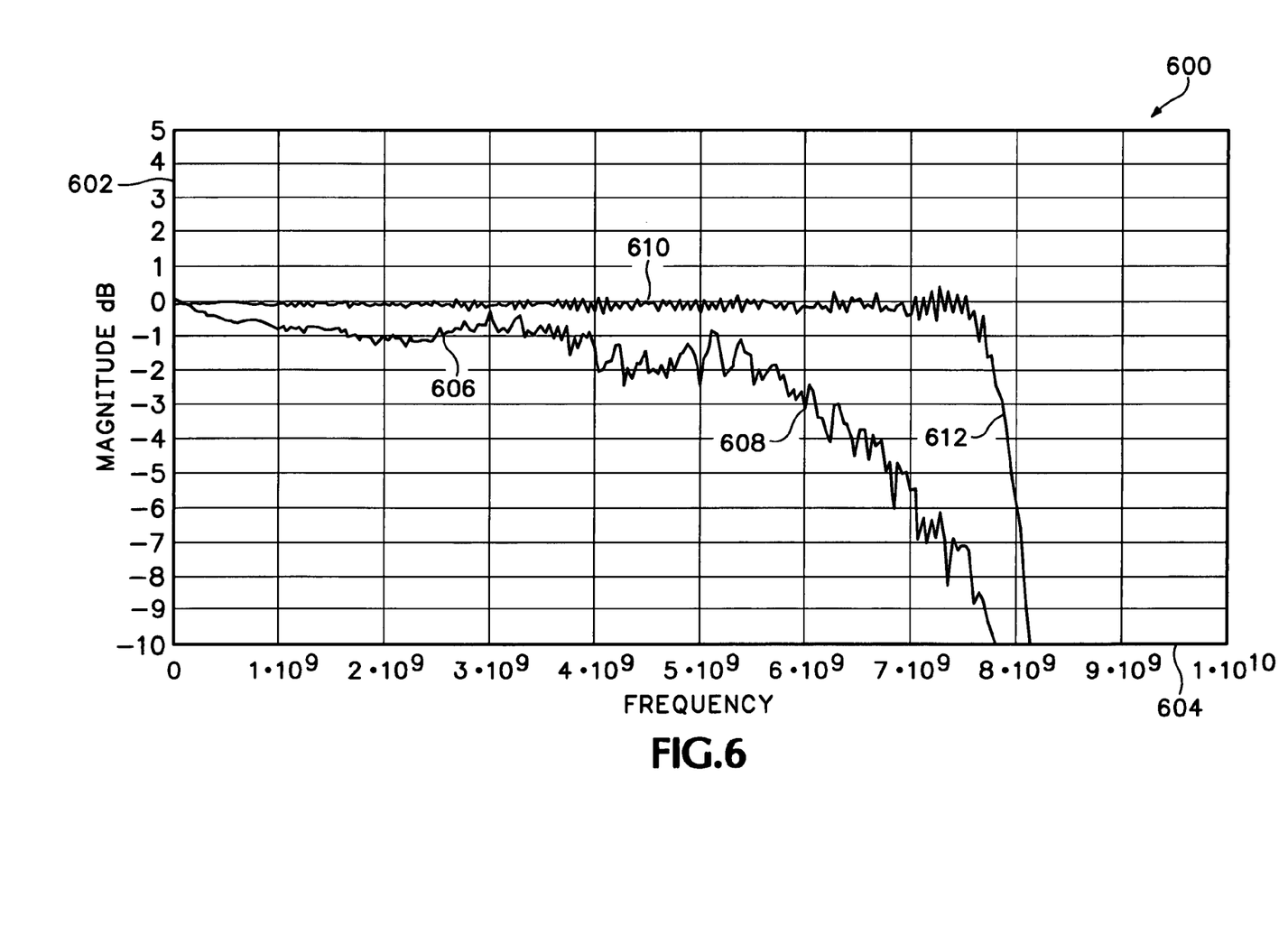
FIG. 6 depicts a graphical representation of frequency responses of an oscilloscope channel before and after application of a bandwidth extension filter.

FIG. 6 depicts a graphical representation 600 of frequency responses of an oscilloscope channel before and after application of a bandwidth extension filter. The graph 600 comprises an ordinate 602 representing signal gain measured in decibels (dB), and an abscissa 604 representing frequency of the signal under test. Two curves are illustratively shown in the graphical representation 600. A first curve 606 represents the frequency response for a signal under test in an instance where bandwidth extension is not provided. That is, the frequency response curve 606 displayed by the display device 190 (e.g., a TDS6604 digital oscilloscope manufactured by Tektronix, Inc.) exhibits non-equalized bandwidth characteristics of the signal across a channel 102. This non-equalized curve 606 occurs when the default "FULL" button 416 is turned on and the analog filters 110 and 112 are turned off. Accordingly, the spectral response of the channel 102 has a bandwidth that is limited by the hardware characteristics of the analog portion (front end) of the signal path, which include undesirable aspects such as stray capacitance, noise, and the like. In this instance, the exemplary SUT carried by the channel has a cutoff frequency of approximately 6 GHz, which is defined at the −3 dB level 608 of the SUT.

The second curve 610 represents the same SUT after the bandwidth extension function 166 has been selected by the user via the bandwidth extension button 420. In particular, the analog SUT is sampled and converted to a digitized signal by the A/D converter 130, as conventionally known in the art. The output of the A/D converter 130 is passed through the decimator 140, without any decimation process occurring, and is then digitally filtered by a digital filter 142, such as a finite impulse response (FIR) filter or infinite impulse response (IIR) filter as conventionally known in the art.

In one embodiment, an algorithm to compute an autocorrelation matrix is defined by equation 1 as:

$$R_{m,n} = \frac{1}{N}\sum_k (^{XZ}k - m)(^{XZ}k - n), \text{ where } k = L \ldots L+N-1, \tag{1}$$

N=is number of points in the XZ data vector, L=_the filter length, m=0 ... L−1, n=0 ... L−1, and XZ=actual impulse response of the scope channel.

A cross correlation algorithm is defined by equation 2 as:

$$P_n = \frac{1}{N}\sum_k (^{dZ}k)(^{XZ}k - n), \tag{2}$$

where dZ=desired response of the scope channel after the filter is applied and the filter coefficients may be computed by equation 3 as follows:

$$W = PR^{-1}. \tag{3}$$

Figure 5:
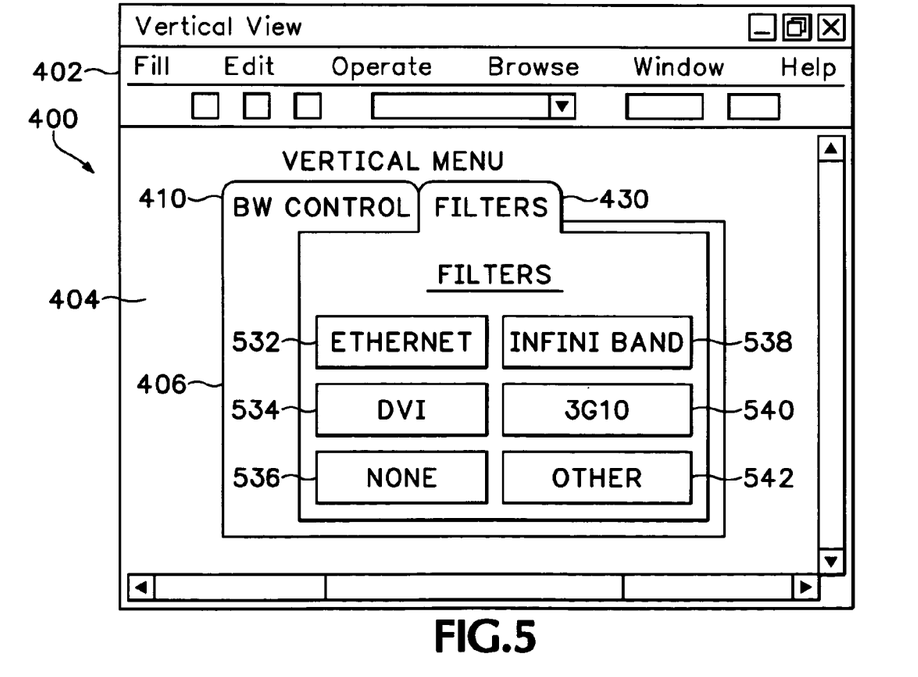

FIG. 5 depicts an exemplary user interface suitable for selecting various types of digital filters 142 that operate under different industry standards. FIG. 5 is the same as FIG. 4, except that the filters section tab 430 has been selected (highlighted). The user is presented with a plurality of filter buttons representing various industry standards for selection. For example, a user may be presented an Ethernet button 532, a digital video interface (DVI) button 534, a no filtering (e.g., "NONE") button 536, an IFINIBAND button 538, a 3 GIO (third generation input/output) button 540, or some other filtering industry standard/type button 542. It is noted that a person skilled in the art will appreciate that other presentation formats may be utilized for the functional aspects of the user interfaces of FIGS. 4 and 5, and such user interfaces should not be considered as being limiting.

A user selects a filter button associated with the type (e.g., an industry standard) of signal being tested. For example, if the SUT is a signal originating from a 3 GIO circuit, then the user selects the 3 GIO button 540. Each type of digital filter 142 is defined by coefficients associated with its respective industry standard. That is, a digital filter 142 for providing filtering for a 3 GIO signal under test has different filtering coefficients than a digital filter for providing filtering for an Ethernet, DVI, or Ifiniband signal under test. The selected digital filter 142 filters the SUT using the various coefficients corresponding to the industry standard to produce a filtered output signal that is sent to memory 150 for processing by the process and display controller 160, as discussed above.

Referring to FIG. 6, the second curve 610 represents a SUT carried by a channel 102 that has been equalized using one of the digital filters 142 associated with a particular standard for such SUT. For example, the user may have selected the Ethernet button 532 as the desired digital filter 142 for the signal under test. It is noted that the BW extension only takes place on custom filters that might require it. Otherwise these custom filter choices are likely to operate at reduced bandwidth, rather then extended bandwidth.

Further, the digital filter 142 also flattens out the response curve 612, as compared with the non-equalized curve 606. That is, the gain across the frequency spectrum prior to the roll-off frequency is substantially equalized, as compared to the non-equalized waveform 606.

Thus, a user may select the bandwidth extension function 166 of the present invention to extend the bandwidth, as well as flatten out the gain of the signal under test, as opposed to prior art digital oscilloscopes, which do not have such capabilities. The bandwidth extension function 166 allows a user to observe higher frequency components of a signal under test in a particular channel.

It is noted that the bandwidth extension function 166 may be selected for a plurality of SUTs respectively carried by a plurality of channels 102. for example, if the four channels $102_{1-4}$ each carry a SUT, bandwidth extension may be implemented on all four SUT. Further, the user may display one or more extended SUTs on the display device 190 for comparative purposes, among others.

Figure 7:
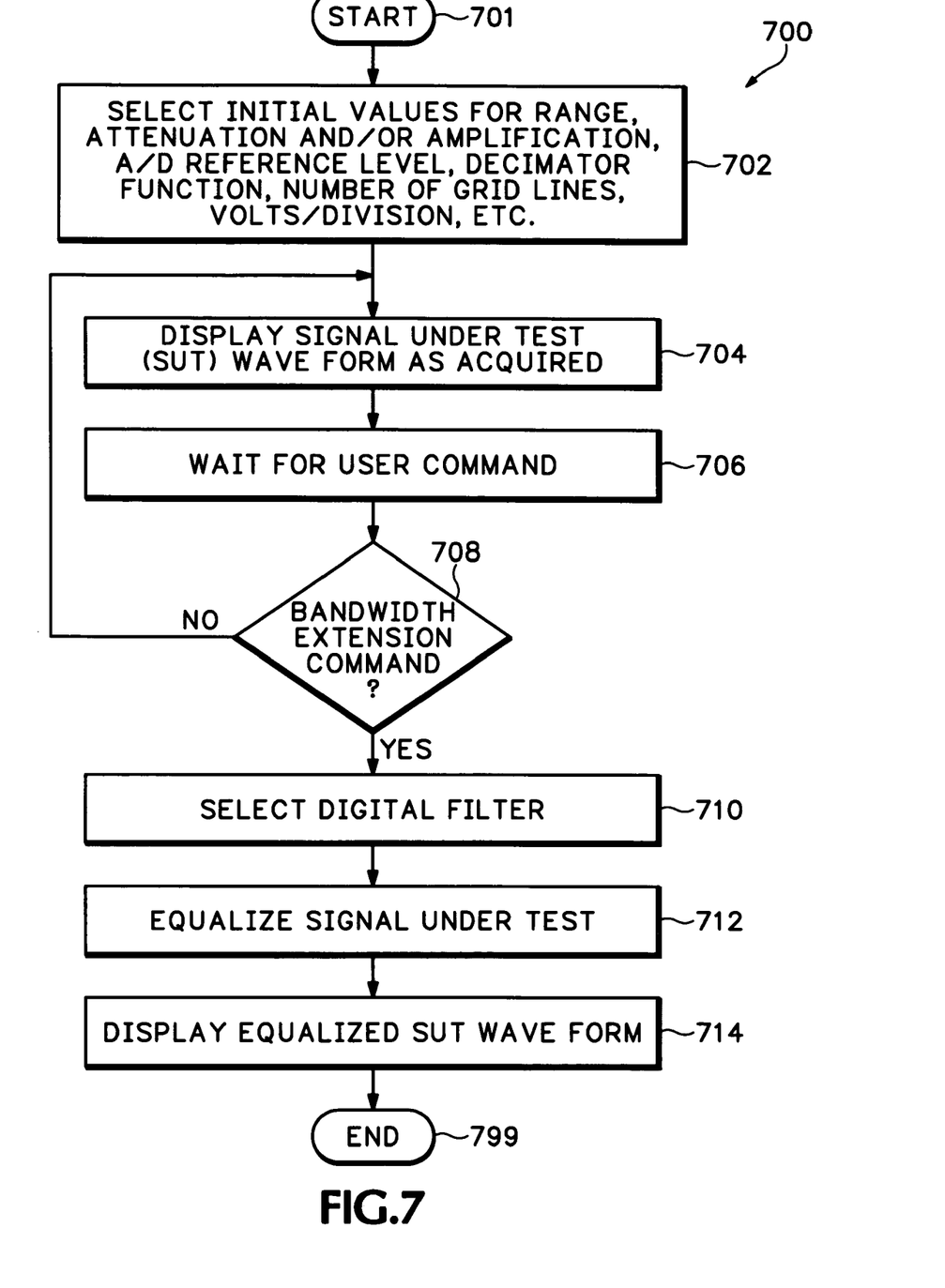
FIG. 7 depicts a flow diagram of a method for providing bandwidth extension for the signal under test.

FIG. 7 depicts a flow diagram of a method 700 for providing bandwidth extension for the signal under test. The method 700 of FIG. 7 is suitable for use in the signal acquisition and measurement system 100 of FIG. 1 to provide to a user with additional control functionality in accordance with the present invention.

Specifically, the method 700 is entered at step 701 and proceeds to step 702, where initial values for range, amplification and/or attenuation, A/D reference level, decimator function, number of grid lines, voltage per division, and the like are selected. Step 702 may be implemented as, for example, a portion of an automatic triggering or setup routine adapted for initially acquiring a signal under test. Step 702 may also be implemented by selecting default values or utilizing the most recent values.

At step 704, the waveform of the signal under test, as acquired, is displayed. That is, at step 704 the waveform(s) of one or more acquired signals under test are displayed utilizing range parameters and grid display parameters initially selected at step 702 or subsequently modified, as discussed below with respect to steps 708–714. Referring to FIG. 6, exemplary first curve 606 represents the displayed waveform of the signal under test having a cutoff frequency at approximately 6 GHz, as defined by the −3 dB level of the SUT at 608.

At step 706 of FIG. 7, the processing and display controller 160 of the DSO 100 waits for a user command. Specifically, a user may input a user command via the input device 170 of the scope. At step 708, a determination is made as to whether a user has initiated a bandwidth extension command. In particular, the user may select the bandwidth control tab 410 of the vertical menu illustratively shown in FIG. 4 to subsequently select the bandwidth extension button 420.

If at step 708 the command is not a bandwidth extension command, then the method 700 continues to display the non-equalized SUT waveform, as acquired, at step 704, unless the user executes some other command, such as selecting an analog filter (buttons 412 or 414 of FIG. 4), system setup, system configuration, and the like. If at step 708, the command is a bandwidth extension command, then the method 700 proceeds to step 710.

At step 710, the user is provided with an option to select a specific digital filter associated with the type of SUT. Referring to FIG. 5, a plurality of filters associated with different industry standards is displayed on the filter menu tab 430 of the vertical menu 400. For example, the user may select a digital filter having coefficients set for Ethernet (e.g., button 532), DVI (e.g., button 534), among other digital filters 142 conforming to other industry standards. Each of these digital filter operate only at a specified sample rate associated with the industry standard. If the user does not select a particular digital filter, then the default is no filter. In either case, at step 712, the digital filter 142 filters the SUTs in a conventional manner, and the processing and display controller 160 processes the digitally filtered SUT to form the equalized SUT waveform. At step 714, the equalized SUT waveform is displayed on the display device 190.

Referring to FIG. 6, second curve 610 represents the equalized SUT waveform, as compared to the previously non-equalized SUT waveform depicted by first curve 606. As discussed above, the digital filtering of the SUT extends the bandwidth illustratively to 8 GHZ from the previous non-equalized 6 GHz signal under test. Furthermore, the equalized response curve 610 is flattened out up to the frequencies approaching the −3 dB level, as compared to the non-equalized first curve 606. Accordingly, the bandwidth extension function 166 enables a user to acquire higher frequency components of the signal under test for observation and analysis. The method 700 then proceeds to step 799, where the method 700 ends.

It is noted that the bandwidth extension function 166 is generally utilized when a user seeks to observe higher bandwidth frequency components of a SUT by extending full bandwidth capabilities of the channel. Normally, the first and second filters 110 and 112 are usually turned off, such that the bypass 114 provides an analog signal path to the A/D converters 130.

Further, decimation is normally not performed by the decimators 140 during the bandwidth extension function 166, since the user is typically trying to observe the higher frequency components of the SUT not normally available due to the limitations of the analog front end of the scope. However, one skilled in the art will appreciate that a decimator 140 may be turned on to remove various portions of the SUT, while contemporaneously applying the bandwidth extension function 166. In this instance, the decimated waveform will also have the flattened out characteristics, as well as having an extended bandwidth.

In a second embodiment of the present invention, the channel match function 168 allows a user to digitally match the frequency responses between multiple channels. In particular, digital filter equalization is used to slightly reduce the normally "full bandwidth" of the analog channel in order to flatten the averaged response within 0.3 dB accuracy between channels over the bandwidth, as well as provide a linear phase response. However, other non-linear phase responses could be adopted for special case to minimize pre-shoot ringing on a step function input of SUT.

Figure 8:
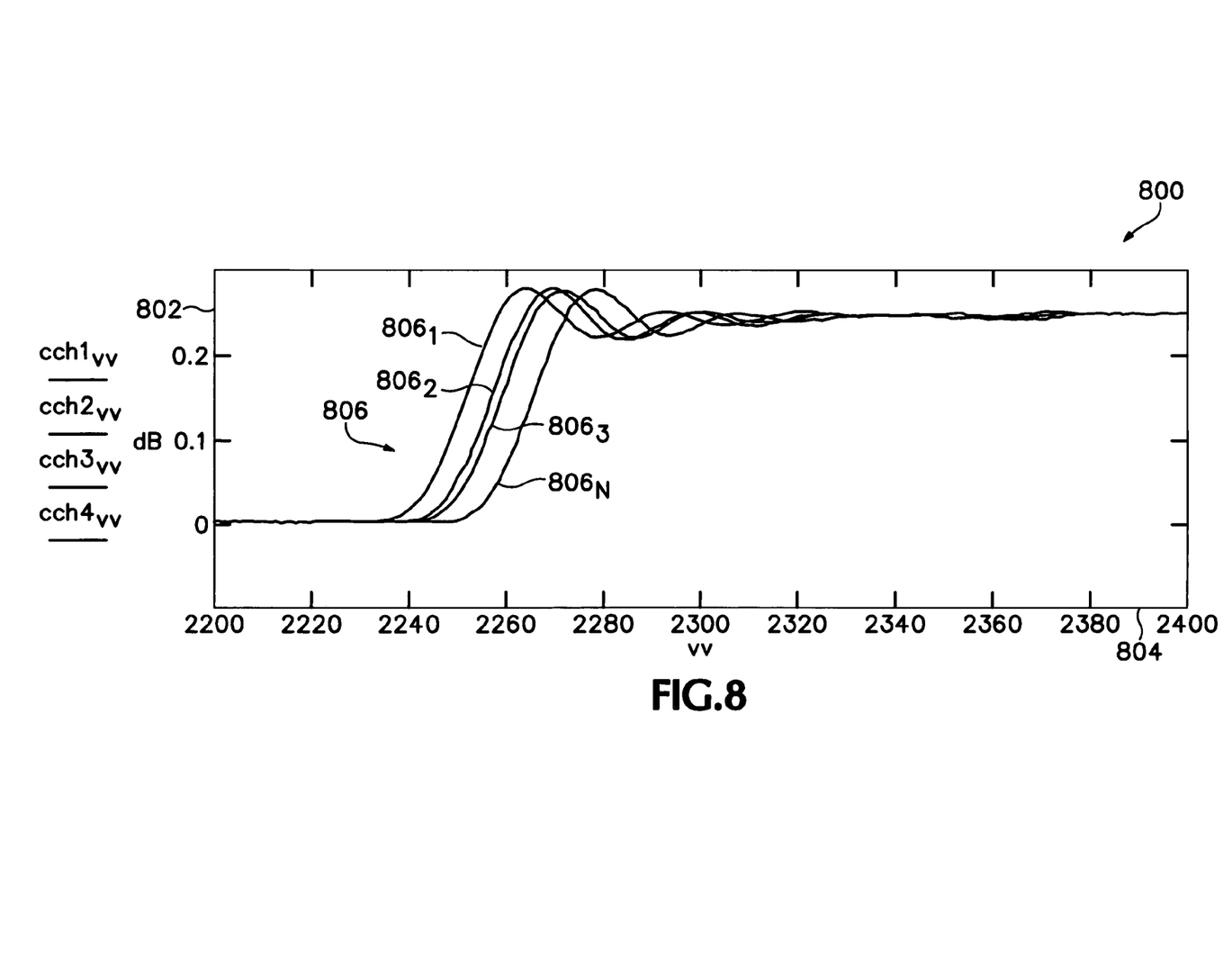
FIG. 8 depicts a graphical representation of a plurality of channel waveforms excluding a channel matching function of the present invention.

FIG. 8 depicts a graphical representation 800 of a plurality of channel waveforms 806 excluding a channel matching function 168 the present invention. The graph 800 comprises an ordinate 802 representing signal gain as measured in volts (V), and an abscissa 804 representing time for a plurality of signals under test. Four waveforms $806_1$–$806_4$ are illustratively shown in the graphical representation 800, although N waveforms may be displayed corresponding to the N channels $102_N$, where N is an integer greater than 1. That is, each waveform 806 represents a signal under test through a corresponding channel 102.

For example, a first curve $806_1$ represents an exemplary time domain response for a signal under test through the first channel $102_1$, second curve $806_2$ represents an exemplary time domain response for a signal under test illustratively through the second channel $102_2$, and so forth, to $N^{th}$ curve $806_N$, which represents an exemplary time domain response for a signal under test through the $N^{th}$ channel $102_N$. The channel matching function 168 of the present invention is turned off, and the exemplary spectral responses of each curve 806 are non-equalized.

Each channel waveform represents the time domain step response, which includes any undesirable signal path characteristics, such as stray capacitance, impedance mismatch, and the like, attributed to the analog circuitry of the signal path. That is, the channel waveforms are limited by the hardware characteristics of the front end of the scope, which includes the buffers 104, attenuators 106, bypass signal path 114, amplifiers 118, and track and hold circuit 120, and the like. It is noted that normally the non-equalized step response 806 occur when the default "FULL" button 416 is turned on, such that the analog filters 110 and 112 are turned off. Thus, the graphical representation 800 of FIG. 8 illustrates that each channel 102 may have gain differentials (e.g., approximately 2.4 dB variations) at a particular frequency, as well as be out-of-phase with each other. Accordingly, as shown in FIG. 8, each waveform 806 is out-of-phase with each other.

Figure 9:
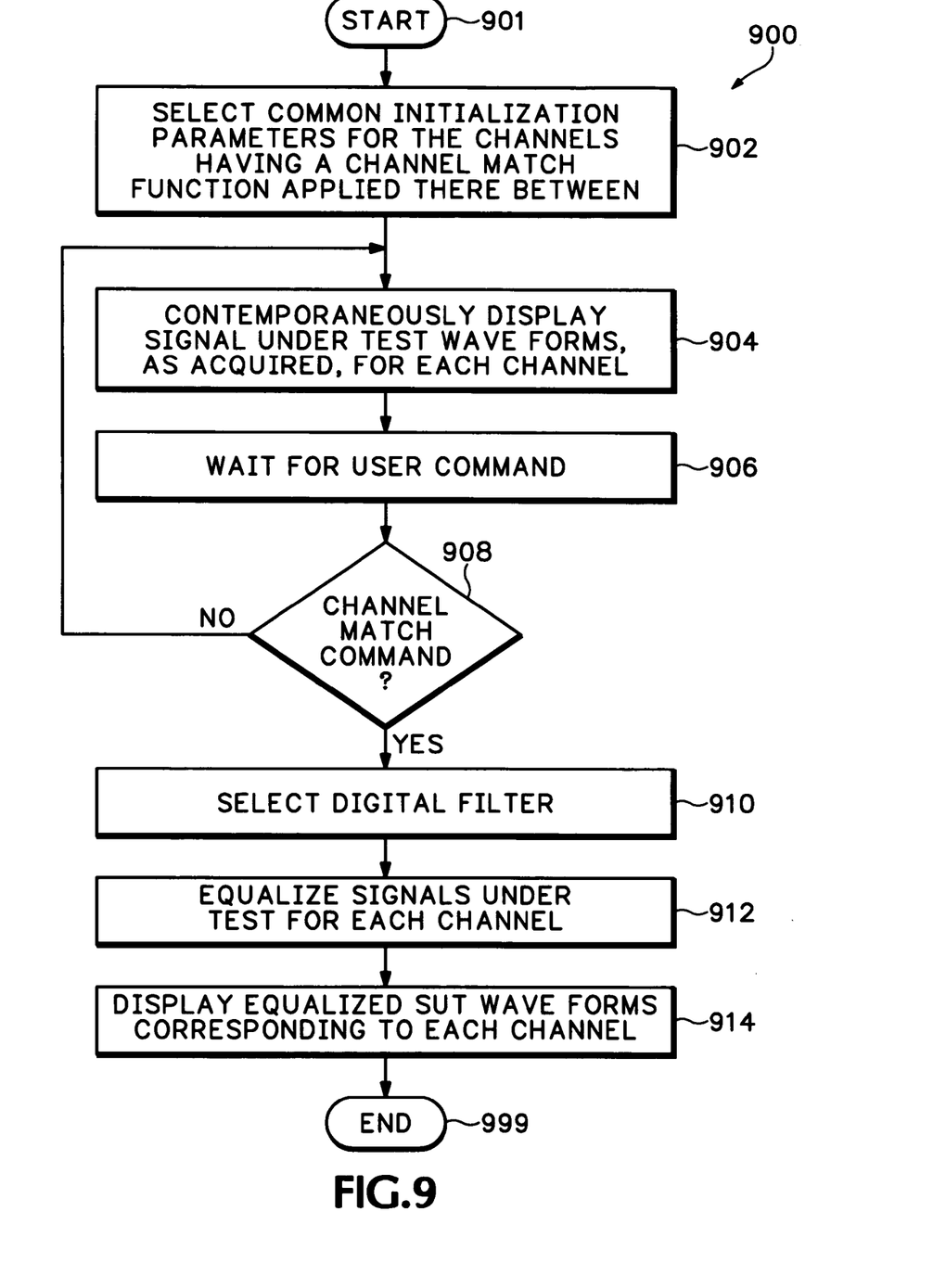
FIG. 9 depicts a flow diagram of a method for providing the channel matching function of the present invention.

FIG. 9 depicts a flow diagram of a method 900 for providing the channel matching function 168 of the present invention. The method 900 of FIG. 9 is suitable for use in the signal acquisition and measurement system 100 of FIG. 1 to provide to a user with additional control functionality in accordance with the present invention.

Specifically, the method 900 is entered at step 901 and proceeds to step 902, where initial values for range, amplification and/or attenuation, A/D reference level, decimator function, number of grid lines, voltage per division, and the like are selected. Step 902 may be implemented as, for example, a portion of an automatic triggering or setup routine adapted for initially acquiring a signal under test. Step 902 may also be implemented by selecting default values or utilizing the most recent values.

At step 904, the waveforms of the signals under test, as acquired, are displayed. The waveforms may be displayed utilizing range parameters and grid display parameters initially selected at step 902 or subsequently modified as discussed below with respect to steps 908–914. It is noted that it is not necessary to have two waveforms selected with channel match filter, and that only one channel may be on, if desired. Referring to FIG. 8, exemplary first curve through fourth curve $806_{1-4}$ represents the displayed waveforms of the signals under test respectively associated with the first channels through fourth channels $102_{1-4}$.

Referring to step 906 of FIG. 9, the processing and display controller 160 of the DSO 100 waits for a user command. Specifically, a user may input a user command utilizing the input device 170 of the scope. At step 908, a determination is made as to whether a user initiates a channel match function 168 command. In particular, the user may use the exemplary bandwidth control tab 410 of the vertical menu illustratively shown in FIG. 4 to select the bandwidth channel match button 418.

If at step 908, the command is not a channel match command, then the method 900 continues to display the SUT waveforms, as acquired, at step 904, unless the user executes some other command, such as selecting an analog filter (buttons 412 or 414 of FIG. 4), system setup, system configuration, and the like. If at step 908, the command is a channel match command, then the method 900 proceeds to step 910.

At step 910, the user is provided with an option to select a specific digital filter associated with the industry standard of SUTs. Referring to FIG. 5, a plurality of filters associated with different commercial standards is displayed on the vertical menu 400. For example, the user may select a digital filter 142 having coefficients set for Ethernet (e.g., button 532), DVI (e.g., button 534), among other digital filters for conforming to other standards. Each of these digital filter standards operate only at a specified sample rate associated with the standard. The selected digital filter is commonly applied to all of the channels 102 having a signal under test. If the user does not select a particular digital filter, then the default is to apply a digital filter having generic or conventionally known coefficients. In either case, at step 912, the digital filters 142 associated with each channel 102 filter the SUTs in a conventional manner, and the processing and display controller 160 processes the digitally filtered SUTs to form the equalized SUT waveforms. At step 914, the equalized SUT waveforms are displayed on the display device 190.

It is noted that the coefficients selected for the digital filters 142 during channel extension 168 are different than those when the bandwidth extension function 166 is implemented. In particular, it may be that the user is more concerned with matching the channels then extending the bandwidth. Therefore, a prototype filter for channel match will have slightly less bandwidth than the scope channel with no filter on. Thus, matching is obtained without increased noise as would occur with bandwidth extension.

Figure 10:
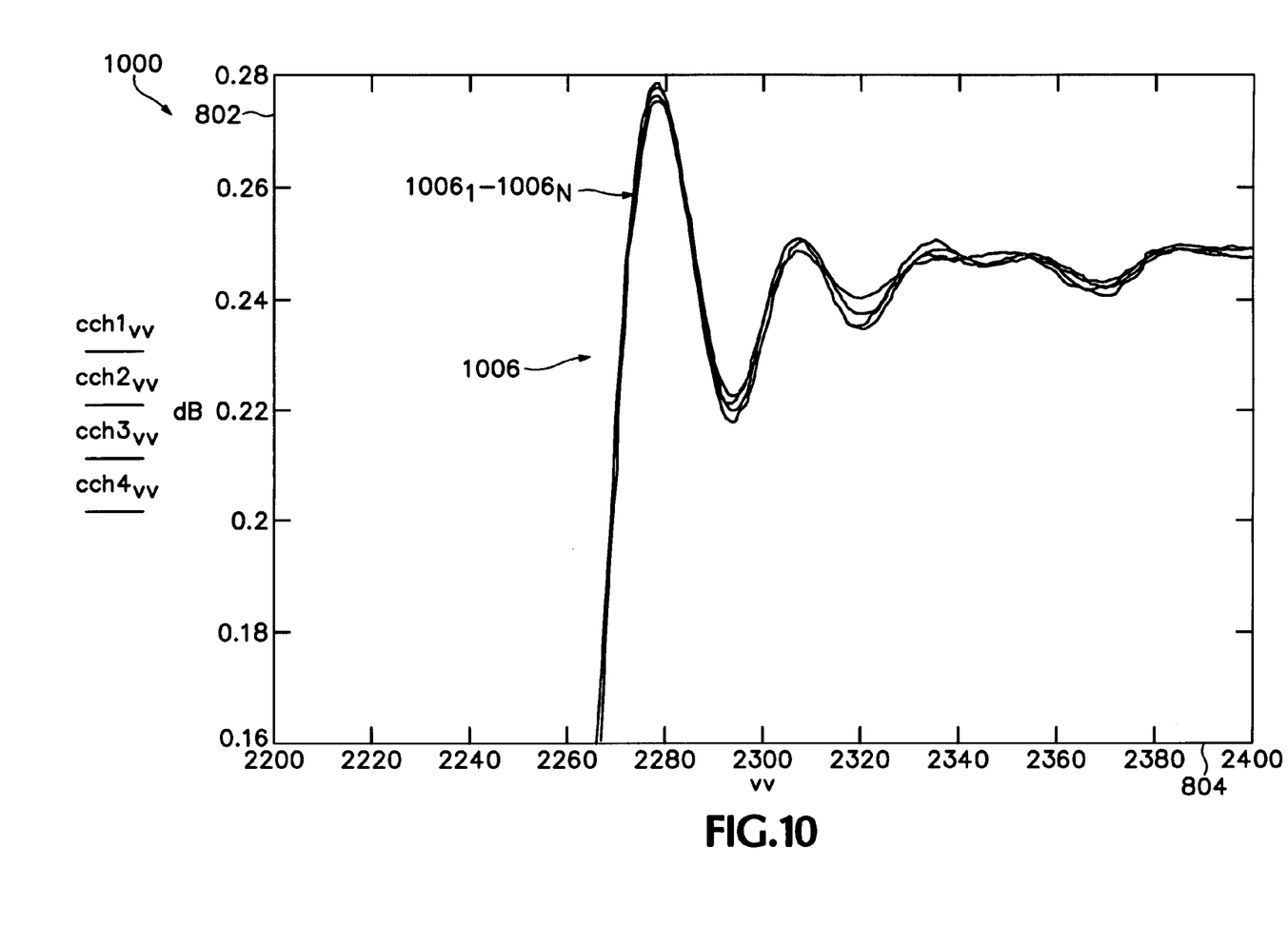
FIG. 10 depicts a graphical representation of waveforms useful in understanding the channel matching function of the present invention.

FIG. 10 depicts a graphical representation 1000 of waveforms 1006 useful in understanding the channel matching function 168 of the present invention. The graph 1000 comprises an ordinate 802 representing signal amplitude as measured in volts (V), and an abscissa 804 representing time of a signal under test, as discussed above with respect to FIG. 8. The four waveforms $806_1$–$806_4$ of FIG. 8 are now shown as non-equalized waveforms $1006_1$–$1006_4$ of the graphical representation 1000. Each waveform 1006 represents a signal under test through a corresponding channel 102 without the channel match function being applied to the waveforms.

For example, a first curve $1006_1$ represents an exemplary time domain response for the signal under test through the first channel $102_1$, second curve $1006_2$ represents an exemplary spectral response for a signal under test illustratively through the second channel $102_2$, and so forth, to $N^{th}$ curve $1006_N$, represents an exemplary time domain response for a signal under test through the $N^{th}$ channel $1002_N$. FIG. 10 is illustrates that the channels are not matched very well before the filter is applied.

When a user selects the channel matching function 168 via channel match button 418, each channel is matched to obtain a response similar to the response curve 610 of FIG. 6, but with reduced BW. That is, the exemplary response curve 610 will be shifted to the left such that its 3 dB down point 612 is at the same position as the 3 dB down point of 606. In other words, the channel match function 168 flattens the curve, but does not extend the bandwidth of the SUT.

In particular, the gain differentials between each channel 102 are much closer (e.g., within 0.3) to each other, as opposed to when the channels 102 are not channel matched (compare FIGS. 8 and 10). That is, the channel match function 168 compensates for undesirable characteristics in the front end of the scope (e.g., the buffers 104, attenuators 106, bypass signal path 114, amplifiers 118, and track and hold circuit 120, and the like). As noted above, the channel matched equalized waveforms occur when the default "Channel Match" button 418 is turned on and the analog filters 110 and 112 are turned off. Recall, that the Full button 416 is used to turn off the analog filters and run with the scopes at full bandwidth.

The above-described invention advantageously provides a technique to extend the bandwidth of a signal under test, as well as flatten out the spectral response by providing digital filtering to the SUT. Furthermore, in a second embodiment, digital filtering may be implemented across a plurality of channels to provide channel matching, such that the plurality of channels has substantially the same gain across the spectrum, as well as are in-phase with each other. Such bandwidth extension and channel match functions 166 and 168 are provided by implementing various digital filtering techniques known in the art. In one embodiment, the BW extension function 166 and channel match function 168 operate at high sample rate settings of the scopes 100, as opposed to operating at decimated rates. As a result, the difficult issues involve with recomputing and managing filters are avoided. Further, if the user reduces the sample rate in either of the BW extension or channel match modes of operation, then these filter modes are turned off. In one embodiment, if a user pushes the BW extension button 420 or channel match button 418 when the sample rate is too low, then a pop-up window is activated to notify the user that the sample rates will be increase. The user is also presented the option to select "OK" or "cancel". Accordingly, one aspect of the present invention is to safeguard the bandwidth extension and channel match functions 166 and 168 to operate in an optimal manner.

It will be appreciated by those skilled in the art that each combination and/or permutation of the digital filter, analog filter (or bypass), attenuation level, and the like are initially calibrated at a time a signal acquisition and measurement system 100 is manufactured. During this calibration process, digital filter coefficients appropriate to the selected attenuation level and analog filters (or bypass) of a particular channel 102 may be selected and stored for subsequent use. During such calibration process, each of a plurality of test signals are applied as signals under test to each of the channels, such that substantially all of the attenuation levels, analog filter (or bypass) selections, and the like may be matched with the appropriate sets of coefficients within the digital filtering function. It is further noted that additional test/calibration procedures may be performed depending on the decimation functions used, such that an expanded set of digital filter coefficients may be stored for subsequent use.

In one embodiment of the invention, a step function is applied to the channel being calibrated during manufacturing. The derivative of the result is computed to obtain the impulse response. The impulse response of the desired channel characteristic with the filter applied is pre-computed as a part of original design engineering activities and is stored in the oscilloscope's firmware. The auto-correlation matrix, R, for the channel response is computed according to equation (1) shown above. The cross correlation vector, P, between these two responses is computed according to equation (2) shown above. Finally the FIR filter coefficients, W, are computed according to equation (3) shown above. Then W is stored in non-volatile memory to be recalled under normal use of the oscilloscope. This procedure is repeated for each attenuation setting of the scope for which the filter function will be supported.

While the foregoing is directed to a preferred embodiment of the present invention, one skilled in the art will appreciate that other and further embodiments of the invention may be devised without departing from the basic scope thereof, and the scope thereof is determined by the claims that follow.

What is claimed is:

1. Apparatus, comprising:
  a signal acquisition device for acquiring a signal under test (SUT) and generating therefrom a stream of acquired samples, said signal acquisition device having associated with it a first bandwidth defining a nominal pass band;
  at least one digital filter, for imparting a gain equalization function to said acquired SUT samples within a spectral region including and extending beyond said nominal passband; and
  a controller, for generating a display signal suitable for use by a display device, said display signal representing waveform imagery associated with said gain equalized SUT.

2. The apparatus of claim 1, wherein:
  said spectral region including and extending beyond said first bandwidth defines a second bandwidth further defining a second pass band; and
  said at least one digital filter selectively amplifying signal components within a spectral region delineated by said first and second bandwidths.

3. The apparatus of claim 1, wherein said signal acquisition device comprises:
  an amplifier, for controllably amplifying said SUT to produce an amplified SUT; and
  an analog to digital (A/D) converter, for sampling said amplified SUT to form thereby said stream of acquired samples.

4. The apparatus of claim 1, wherein said at least one digital filter has associated with it, filter coefficients adapted for filtering a SUT according to at least one of Ethernet, DVI, 3 GIO, and Ifiniband.

5. The apparatus of claim 1, wherein said controller generates a graphical user interface (GUI) suitable for use by said display device, said controller adapting operating parameters of said digital filter in response to user selections.

6. The apparatus of claim 5, wherein said GUI comprises at least one of a selectable bandwidth control menu and a selectable digital filter menu.

7. The apparatus of claim 6, wherein said bandwidth control menu comprises a selectable bandwidth extension feature.

8. The apparatus of claim 7, wherein said bandwidth control menu further comprises selectable analog filtering control features.

9. The apparatus of claim 8, wherein said analog filtering control features are turned off during said gain equalization function.

10. The apparatus of claim 6, wherein said digital filter menu comprises:
  a plurality of digital filter selections for enabling user selection of digital filter coefficients adapted for a SUT according to at least one of Ethernet, DVI, 3 GIO, and Ifiniband.

11. The apparatus of claim 1, wherein said waveform imagery comprises gain as a function of frequency response of said digitally filtered SUT.

12. Apparatus, comprising:
  a signal acquisition device, having a plurality of channels for acquiring respective signals under test (SUT) and generating therefrom respective streams of acquired samples;
  a plurality of digital filters, each of said digital filters associated with a respective channel, for filtering respective acquired SUT samples; and
  a controller, for generating a display signal suitable for use by a display device, said display signal representing waveform imagery associated with at least one of said digitally filtered SUT sample streams, wherein said controller, in a first mode of operation, causes said digital filters to operate in a manner tending to equalize gain parameters of said plurality of channels.

13. The apparatus of claim 12, wherein said plurality of channel waveforms are substantially in-phase.

14. The apparatus of claim 12, wherein said signal acquisition device comprises:
  an amplifier, for controllably amplifying said SUT to produce an amplified SUT; and
  an analog to digital (A/D) converter, for sampling said amplified SUT to form thereby said stream of acquired samples.

15. The apparatus of claim 12, wherein said plurality of digital filters have associated with it, coefficients adapted for a SUT according to at least one of Ethernet, DVI, 3 GIO, and Ifiniband.

16. The apparatus of claim 12, further comprising a graphical user interface (GUI) displayed by said display device in response to a user initiating vertical control parameters for said SUT.

17. The apparatus of claim 16, wherein said GUI comprises at least one of a selectable bandwidth control menu and a selectable digital filter menu.

18. The apparatus of claim 17, wherein said bandwidth control menu comprises a selectable channel matching feature.

19. The apparatus of claim 18, wherein said bandwidth control menu further comprises selectable analog filtering control features.

20. The apparatus of claim 19, wherein said analog filtering control features are turned off during said first mode of operation.

21. The apparatus of claim 16, wherein said digital filter menu comprises:
a plurality of digital filter selections for enabling user selection of digital filter coefficients adapted for a SUT according to at least one of Ethernet, DVI, 3 GIO, and Ifiniband.

22. The apparatus of claim 12, wherein said waveform imagery comprises gain as a function of frequency response of said digitally filtered SUTs.

23. A method, comprising:
acquiring an analog signal under test (SUT);
generating therefrom, a stream of acquired samples having associated with it a first bandwidth defining a nominal pass band;
digitally filtering said acquired SUT samples for imparting a gain equalization function to said acquired SUT samples within a spectral region including and extending beyond said first bandwidth, wherein said spectral region including and extending beyond said nominal passband is defined by a second bandwidth; and
generating a display signal suitable for use by a display device, said display signal representing waveform imagery associated with said gain equalized SUT.

24. The method of claim 23, further comprising:
selectively amplifying signal components within said spectral region delineated by said first and second bandwidths.

25. In a signal acquisition device, having a plurality of channels for acquiring a respective plurality of analog signals under test (SUT), a method, comprising:
generating from said acquired plurality of SUTs, respective streams of acquired samples;
selectively imparting a channel matching function to said acquired SUTs; and
generating a display signal suitable for use by a display device, said display signal representing waveform imagery associated with at least one of said digitally filtered SUT sample streams, wherein, in a first mode of operation, said digital filters operate in a manner tending to equalize gain parameters of said plurality of channels.

26. The method of claim 25, wherein said plurality of channel waveforms are substantially in-phase.

* * * * *